United States Patent
Cheng et al.

(10) Patent No.: US 11,031,924 B1
(45) Date of Patent: Jun. 8, 2021

(54) CLOCK MULTIPLIER

(71) Applicant: Nuvoton Technology Corporation, Hsinchu (TW)

(72) Inventors: Yuan-Po Cheng, Hsinchu (TW); Pao-Shu Chang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 17/010,854

(22) Filed: Sep. 3, 2020

(30) Foreign Application Priority Data

Dec. 25, 2019 (TW) .................. 108147573

(51) Int. Cl.
   *H03K 3/038* (2006.01)

(52) U.S. Cl.
   CPC .................. *H03K 3/038* (2013.01)

(58) Field of Classification Search
   CPC ..................................... H03K 3/038
   USPC ......................................... 327/158
   See application file for complete search history.

(56) References Cited

U.S. PATENT DOCUMENTS

| | | | |
|---|---|---|---|
| 6,255,880 B1 * | 7/2001 | Nguyen | H03K 5/00006 327/277 |
| 7,119,591 B1 * | 10/2006 | Lin | H03D 13/004 327/158 |
| 2005/0237093 A1 * | 10/2005 | Wilhite | H03K 5/133 327/158 |
| 2008/0100357 A1 * | 5/2008 | Bae | H03L 7/10 327/158 |
| 2013/0077418 A1 * | 3/2013 | Aoki | H03L 7/0812 365/194 |
| 2016/0056806 A1 * | 2/2016 | Rapinoja | H03L 7/0816 327/158 |

FOREIGN PATENT DOCUMENTS

| | | |
|---|---|---|
| TW | 201006133 | 2/2010 |
| TW | 201007424 | 2/2010 |

* cited by examiner

*Primary Examiner* — Tomi Skibinski
(74) *Attorney, Agent, or Firm* — JCIPRNET

(57) ABSTRACT

A clock multiplier is provided. The clock multiplier includes a delay line, an output clock generator, and a delay controller. The delay line receives an input clock and delays the input clock according to a selection signal group with multiple bits to provide a plurality of delayed clocks and a feedback clock. The output clock generator performs a logic operation on the input clock and a portion of the delayed clocks to generate an output clock. A frequency of the output clock is an integer multiple of a frequency of the input clock. The delay controller adjusts the selection signal group according to a timing difference between the input clock and the feedback clock, so that a transition point of the feedback clock approaches a transition point of the input clock.

20 Claims, 12 Drawing Sheets

US 11,031,924 B1

CLOCK MULTIPLIER

CROSS-REFERENCE TO RELATED APPLICATION

This application claims the priority benefit of Taiwan application serial no. 108147573, filed on Dec. 25, 2019. The entirety of the above-mentioned patent application is hereby incorporated by reference herein and made a part of this specification.

BACKGROUND OF THE INVENTION

1. Field of the Invention

The invention relates to a clock multiplier, and more particularly, to a clock multiplier having an accurate frequency multiplication effect.

2. Description of Related Art

Generally, in order to allow a low-frequency input clock to be applicable to an electronic device with high-frequency operations, the clock multiplier may perform frequency multiplication processing on an input clock to increase a frequency of the input clock and generate a high-frequency output clock. However, when a plurality of elements of the electronic device need to be operated via a plurality of output clocks, respectively, once timing of the plurality of output clocks deviates, misoperation may occur in the plurality of elements of the electronic device.

For example, an audio playback device is used as an example. Once the timing of the plurality of output clocks is deviated, the audio playback device may play unexpected content at a specific time, thereby affecting the experience of a user.

Therefore, how to improve the frequency multiplication effect of the clock multiplier is one of the development focuses of the clock multiplier.

SUMMARY OF THE INVENTION

The invention provides a clock multiplier having an accurate frequency multiplication effect.

The clock multiplier of the invention includes a delay line, an output clock generator, and a delay controller. The delay line is configured to receive an input clock, and the input clock is delayed according to a selection signal group with multiple bits to provide a plurality of delayed clocks and feedback clocks. The input clock, the plurality of delayed clocks, and the feedback clock have a same clock cycle. The output clock generator is coupled to the delay line. The output clock generator is configured to receive an input clock and the plurality of delayed clocks, and perform a logical operation on the input clock and a portion of the plurality of delayed clocks to generate an output clock. A frequency of the output clock is $2^L$ times a frequency of the input clock, where L is a positive integer. The delay controller is coupled to the delay line. The delay controller is configured to receive the input clock and the feedback clock and adjust the selection signal group according to a timing difference between the input clock and the feedback clock, so that a transition point of the feedback clock approaches a transition point of the input clock.

Based on the above, the delay controller of the invention may adjust the selection signal group according to the timing difference between the input clock and the feedback clock, so that the transition point of the feedback clock approaches the transition point of the input clock. In this way, the delay controller of the invention may perform accurate frequency multiplication processing on the input clock.

To make the features and advantages of the invention clear and easy to understand, the following gives a detailed description of embodiments with reference to accompanying drawings.

DESCRIPTION OF THE EMBODIMENTS

Figure 1:
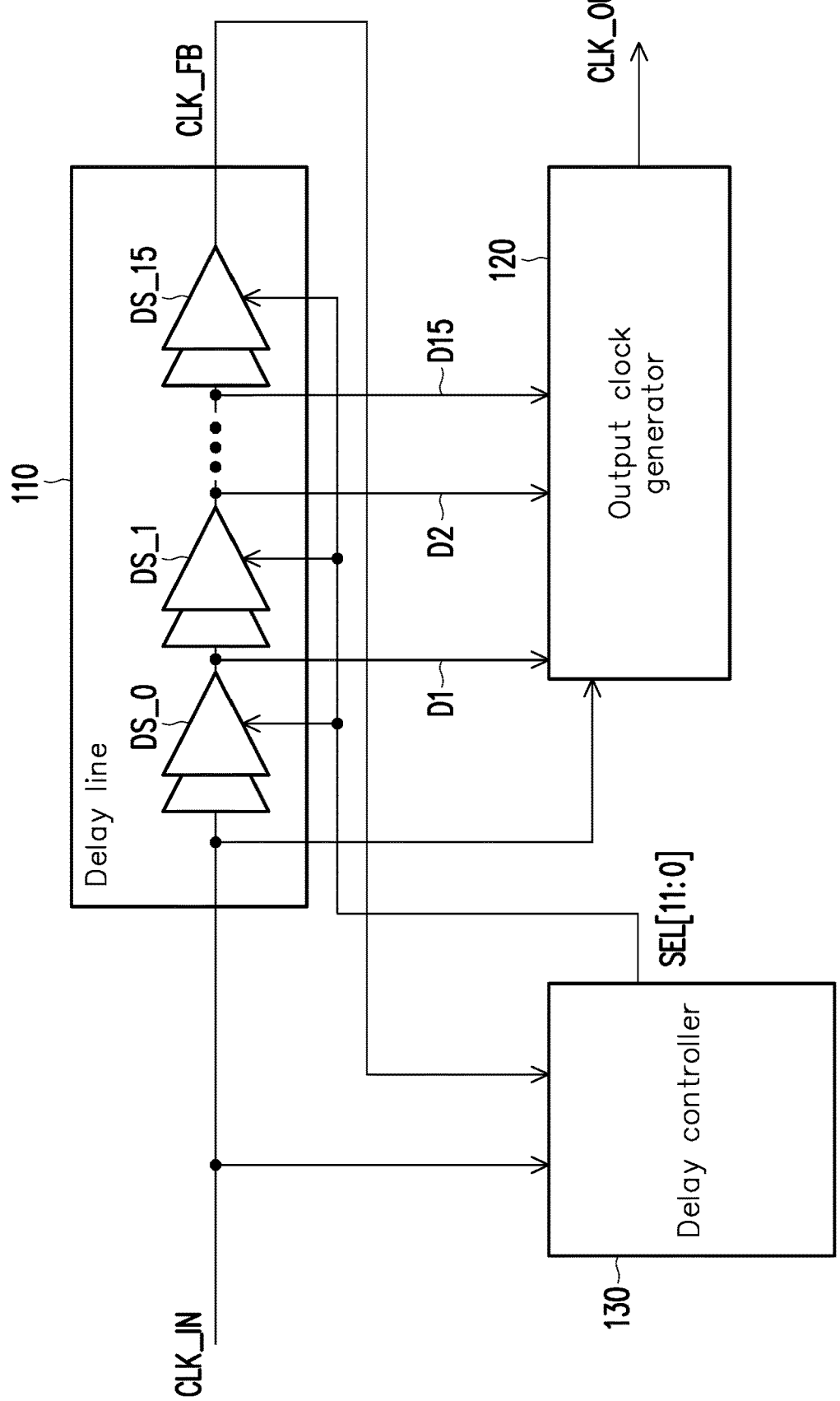
FIG. 1 is a schematic circuit diagram of a clock multiplier according to an embodiment of the invention.

Referring to FIG. 1, FIG. 1 is a schematic circuit diagram of a clock multiplier according to an embodiment of the invention. In the present embodiment, a clock multiplier 100 includes a delay line 110, an output clock generator 120, and a delay controller 130. The delay line 110 receives an input clock CLK_IN and delays the input clock CLK_IN group SEL[11:0], to provide delayed clocks D1-D15 and a feedback clock CLK_FB. In the present embodiment, the selection signal group SEL[11:0] has 12 bits (the invention is not limited thereto). The input clock CLK_IN, the delayed clocks D1-D15, and the feedback clock CLK_FB have a same clock cycle. The output clock generator 120 is coupled to the delay line 110. The output clock generator 120 receives the input clock CLK_IN and the delayed clocks D1-D15 provided by the delay line 110. The output clock generator 120 performs a logic operation on the input clock CLK_IN and a portion of the delayed clocks D1-D15 to generate an output clock CLK_OUT. A frequency of the output clock CLK_OUT is an integer multiple of a frequency of the input clock CLK_IN.

The delay controller 130 is coupled to the delay line 110. The delay controller 130 receives the input clock CLK_IN and the feedback clock CLK_FB provided by the delay line 110. The delay controller 130 adjusts the selection signal group SEL[11:0] according to a timing difference between the input clock CLK_IN and the feedback clock CLK_FB, so that a transition point of the feedback clock CLK_FB approaches a transition point of the input clock CLK_IN.

It should be noted that, the delay controller 130 of the clock multiplier 100 may adjust the selection signal group SEL[11:0] according to the timing difference between the input clock CLK_IN and the feedback clock CLK_FB. The transition point of the feedback clock CLK_FB approaches the transition point of the input clock CLK_IN according to the selection signal group SEL[11:0]. In this way, the delay controller 130 of the invention may perform accurate frequency multiplication processing on the input clock CLK_IN.

In the present embodiment, the delay line 110 includes 16 delay unit strings DS_0 to DS_15. The delay unit strings DS_0 to DS_15 are coupled in series. In the delay unit strings DS_0 to DS_15, the delay unit string DS_0 is used as a first-stage delay unit string. The delay unit string DS_1 is used as a second-stage delay unit string, and so on. An input terminal of the delay unit string DS_0 receives the input clock CLK_IN and the selection signal group SEL[11:0]. The delay unit string DS_0 delays timing of the input clock CLK_IN according to the selection signal group SEL[11:0] to provide a delayed clock D1. The delay unit string DS_0 outputs the delayed clock D1 via an output terminal of the delay unit string DS_0. An input terminal of the delay unit string DS_1 is coupled to the output terminal of the delay unit string DS_0. The delay unit string DS_1 receives the delayed clock D1 and the selection signal group SEL[1:0]. The delay unit string DS_1 delays timing of the delayed clock D1 according to the selection signal group SEL[11:0] to provide a delayed clock D2. The delay unit string DS_1 outputs the delayed clock D2 via an output terminal of the delay unit string DS_1, and so on. The delay unit string DS_15 is a last-stage delay unit string. The delay unit string DS_15 is a last-stage delay unit string. The delay unit string DS_15 receives the delayed clock D15 and the selection signal group SEL[11:0]. The delay unit string DS_15 delays timing of the delayed clock D15 according to the selection signal group SEL[11:0] to provide the feedback clock CLK_FB.

In the present embodiment, based on the same received selection signal group SEL[11:0], timing of the feedback clock CLK_FB provided by the delay unit string DS_15 lags behind a delay time length of the timing of the delayed clock D15 provided by the delay unit string DS_14. The timing of the delayed clock D15 lags behind a delay time length of timing of the delayed clock D14 provided by the delay unit string DS_13. The timing of the delayed clock D14 lags behind a delay time length of the timing of the delayed clock D13 provided by the delay unit string DS_12, and so on. The delay time length is controlled, so that a cycle of the input clock CLK_IN is an integer multiple of the delay time length.

Figure 2:
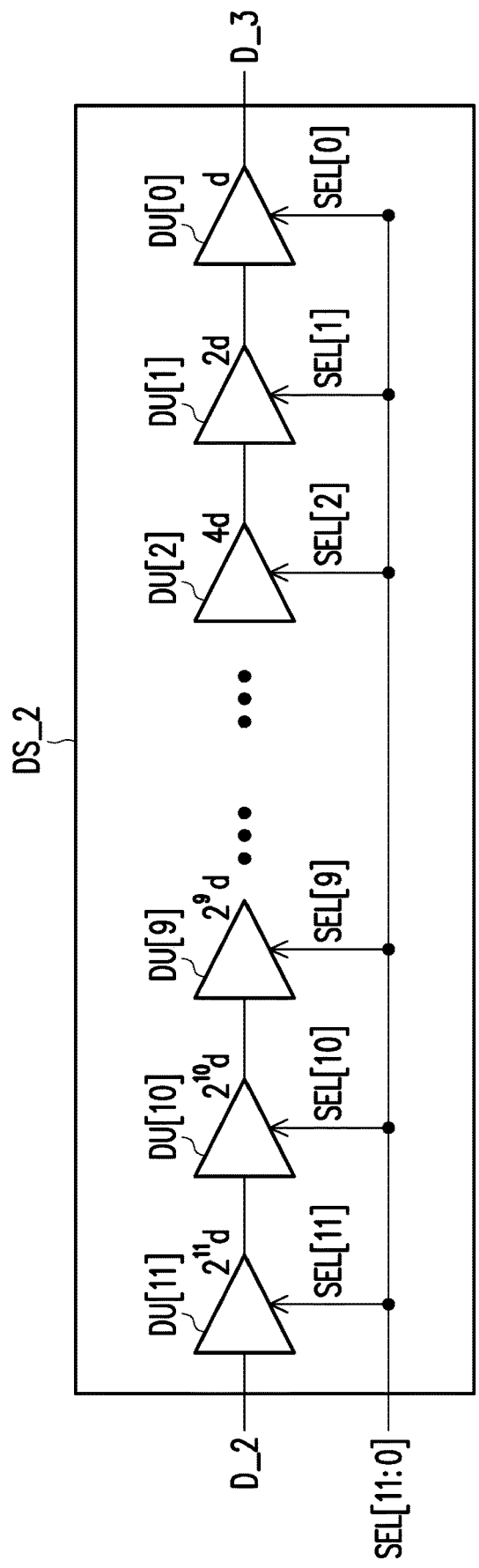
FIG. 2 is a schematic circuit diagram of a delay unit string according to an embodiment of the invention.

Referring to FIG. 2, FIG. 2 is a schematic circuit diagram of a delay unit string according to an embodiment of the invention. In the present embodiment, the delay unit string DS_2 shown in FIG. 1 is used as an example. In the present embodiment, the delay unit string DS_2 includes 12 delay units DU[0] to DU[11]. The delay units DU[0] to DU[11] are coupled in series with each other. In the delay unit string DS_2, the delay unit DU[11] is used as a first-stage delay unit. An input terminal of the delay unit DU[11] is used as an input terminal of a delay unit string DS_2. The delay unit DU[10] is used as a second-stage delay unit. An input terminal of the delay unit DU[10] is coupled to an output terminal of the delay unit DU[11], and soon. The delay unit DU[0] is used as a last-stage delay unit. An output terminal of the delay unit DU[0] is used as an output terminal of a delay unit string DS_2, and provides a delayed clock D3.

The delay units DU[0] to DU[11] correspond to selection signals SEL[0] to SEL[11] in a selection signal group SEL[11:0], respectively. The delay units DU[0] to DU[11] respectively perform delay operations according to logic values of the selection signals SEL[0] to SEL[11]. In the present embodiment, a sum of a plurality of sub-delay time lengths provided by the delay units DU[0] to DU[1] is a delay time length provided by the delay unit string DS_2. In the present embodiment, the plurality of sub-delay time lengths provided by the delay units DU[0] to DU[11] are different from each other.

Further, the sub-delay time length provided by the delay unit DU[0] is equal to a time length unit d. The time length unit d in the present embodiment is, for example, 0.1 nanoseconds. The sub-delay time length provided by the delay unit DU[1] is twice the time length unit d, that is, [$2d$]. The sub-delay time length provided by the delay unit DU[2] is four times the time length unit d, that is, [$2^2d$], and so on. In other words, the sub-delay time length (2nd) provided by the delay unit DU[11] is twice the sub-delay time length ($2^{10}d$) provided by the delay unit DU[10]. The sub-delay time length ($2^{10}d$) provided by the delay unit DU[11] is twice the sub-delay time length ($2^9d$) provided by the delay unit DU[10], and soon. In the present embodiment, the delay unit DU[11] performs a delay operation according to the selection signal SEL[11] with the most significant bit. The delay unit DU[10] performs a delay operation according to the selection signal SEL[10]. Similarly, the delay unit DU[0] performs a delay operation according to the selection signal SEL[0] with the least bit. Therefore, the delay time length is directly proportional to a digital code value of the selection signal group SEL[11:0].

It should be understood that configuration of the delay units in other delay unit strings DS_0, DS_1, DS_3 to DS_15 other than the delay unit string DS_2 shown in FIG. 1 is similar to that of the delay units DU[0] to DU[11].

Figure 3:
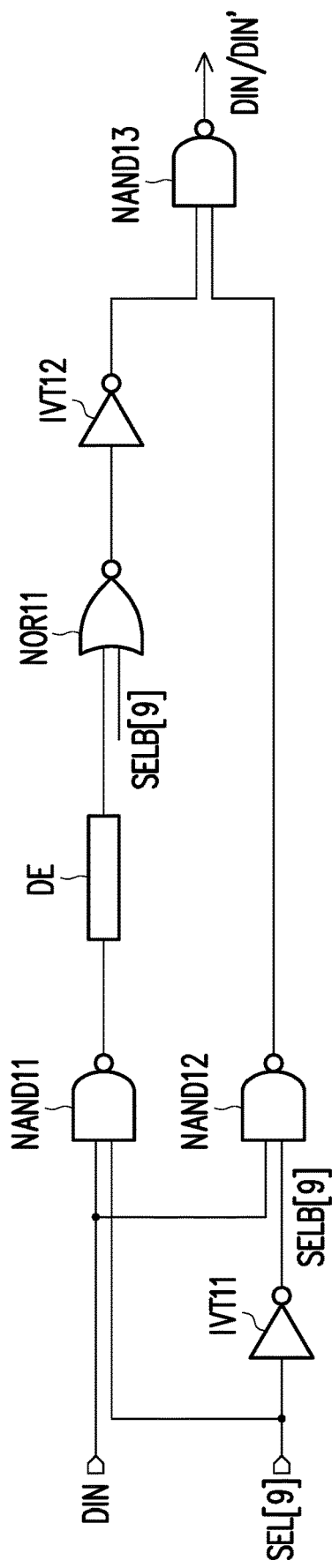
FIG. 3 is a schematic circuit diagram of a delay unit according to an embodiment of the invention.

Referring to FIG. 3, FIG. 3 is a schematic circuit diagram of a delay unit according to an embodiment of the invention. In the present embodiment, the delay unit DU[9] shown in FIG. 2 is used as an example. In the present embodiment, the delay unit DU[9] includes NAND gates NAND11 to NAND13, an inverter IVT11, an inverter IVT12, a NOR gate NOR11, and a delay element DE. A first input terminal of the NAND gate NAND11 and a first input terminal of the NAND gate NAND12 are used as clock input terminals of the delay unit DU[9]. An input terminal of the inverter IVT11 and a second input terminal of the NAND gate NAND11 are used as selection signal input terminals of the delay unit DU[9]. An output terminal of the inverter IVT11 is coupled to a second input terminal of the NAND gate NAND12. An input terminal of the delay element DE is coupled to an output terminal of the NAND gate NAND11. The delay element DE is configured to provide a time delay length of $2^9d$ (d is, for example, 0.1 nanoseconds). A first input terminal of the NOR gate NOR11 is coupled to an output terminal of the delay element DE, and a second input terminal of the NOR gate NOR11 is coupled to the output terminal of the inverter IVT11. An input terminal of the inverter IVT12 is coupled to an output terminal of the NOR gate NOR11. A first input terminal of the NAND gate NAND13 is coupled to an output terminal of the inverter IVT12. A second input terminal of the NAND gate NAND13 is coupled to an output terminal of the NAND gate NAND12. An output terminal of the NAND gate NAND13 is used as an output terminal of the delay unit DU[9].

In the present embodiment, the delay unit DU[9] receives, via a clock input terminal, a clock DIN provided by a previous-stage delay unit (the delay unit DU[10] shown in FIG. 2). The delay unit DU[9] receives the corresponding selection signal SEL[9] via a selection signal input terminal. When the selection signal SEL[9] is a first logic value (for example, "1"), the output terminal of the NAND gate NAND11 provides an inverted clock DIN. The delay element DE performs a timing delay operation on the inverted clock DIN to delay timing of the inverted clock DIN. The first input terminal of the NOR gate NOR11 receives the delayed and inverted clock DIN. The second input terminal of the NOR gate NOR11 receives the complementary selection signal SELB[9] (that is, the inverted selection signal SEL[9]). Since the complementary selection signal SELB[9] is a second logic value (for example, "0") opposite to the first logic value, the NOR gate NOR11 and the inverter IVT12 jointly provide the delayed and inverted clock DIN to the first input terminal of the NAND gate NAND13 according to the complementary selection signal SELB[9]. The inverter IVT11 inverts the selection signal SEL[9] to generate a complementary selection signal SELB[9]. The NAND gate NAND12 provides a signal having a logic value of "1" to the second input terminal of the NAND gate NAND13. The NAND gate NAND13 performs a logical NAND operation on a signal having a logic value of "1" and the delayed and inverted clock DIN to provide a delayed clock DIN'.

In another aspect, when the selection signal SEL[9] is a second logic value (for example, "0"), the output terminal of the NAND gate NAND11 provides a signal having a logic value of "1". A first input terminal of the NOR gate NOR11 receives a signal having a logic value of "1". The second input terminal of the NOR gate NOR11 receives the complementary selection signal SELB[9]. Since the complementary selection signal SELB[9] is a second logic value (for example, "0") opposite to the first logic value, the NOR gate NOR11 and the inverter IVT12 jointly provide the signal having the logic value of "1" to the first input terminal of the NAND gate NAND13 according to the complementary selection signal SELB[9]. The inverter IVT11 inverts the selection signal SEL[9] to generate a complementary selection signal SELB[9]. The NAND gate NAND12 provides the inverted clock DIN to the second input terminal of the NAND gate NAND13. The NAND gate NAND13 performs a logical NAND operation on a signal having a logic value of "1" and the inverted clock DIN to provide a clock DIN.

Based on the above, when the selection signal SEL[9] is a first logic value, the delay unit DU[9] provides the delayed clock DIN'. When the selection signal SEL[9] is a second logic value, the delay unit DU[9] provides a clock DIN. In other words, the delay unit DU[9] performs a delay operation on the received clock according to a logic value of the selection signal SEL[9].

It should be understood that, based on the foregoing teaching, other delay units DU[0] to DU[8] and DU[10] to DU[15] other than the delay unit DU[9] shown in FIG. 2 also perform delay operations on the received clocks according to logic values of the selection signals SEL[0] to SEL[8] and SEL[10] to SEL[15].

Figure 4A:
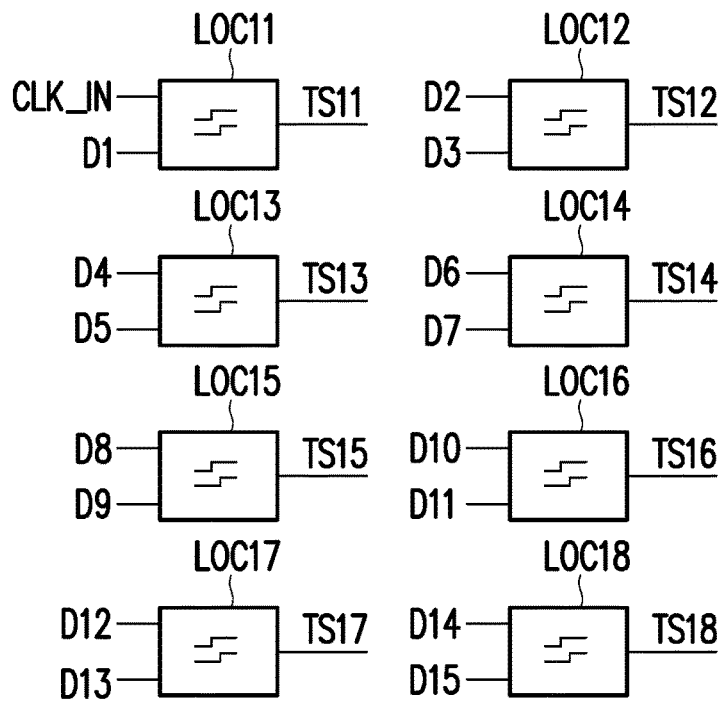
FIG. 4A is a schematic circuit diagram of a delay logic circuit according to a first embodiment of the invention.
Figure 4B:
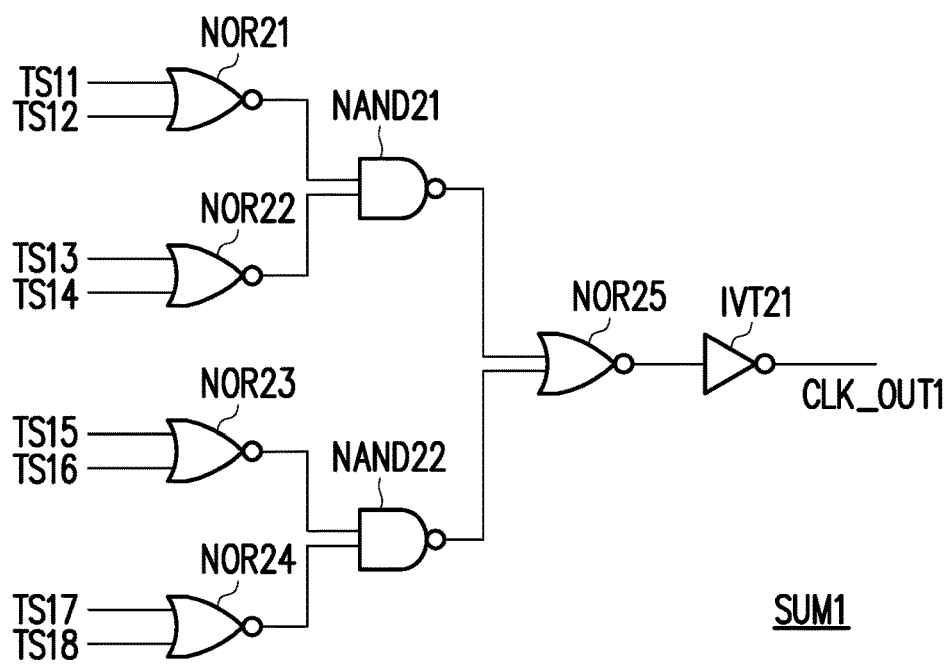
FIG. 4B is a schematic circuit diagram of a summer according to a first embodiment of the invention.

Referring to FIG. 1, FIG. 4A, and FIG. 4B together, FIG. 4A is a schematic circuit diagram of a delay logic circuit according to a first embodiment of the invention. FIG. 4B is a schematic circuit diagram of a summer according to a first embodiment of the invention. In the present embodiment, an output clock generator 120 includes delay logic circuits LOC11 to LOC18 and a summer SUM1. The delay logic circuits LOC11 to LOC18 respectively receive an input clock CLK_IN and two of delayed clocks D1-D15, and perform triggering according to a delay time length between the input clock CLK_IN and the two of the delayed clocks D1-D15 respectively, to provide one of trigger signals TS11-TS18. For example, the delay logic circuit LOC11 receives the input clock CLK_IN and the delayed clock D1. The delay logic circuit LOC11 performs triggering according to the input clock CLK_IN and a delay time length of the delayed clock D1 to provide a trigger signal TS11. The delay logic circuit LOC12 receives delayed clocks D2 and D3. The delay logic circuit LOC12 performs triggering according to delay time lengths of the delayed clocks D2 and D3 to provide a trigger signal TS12. The delay logic circuit LOC13 receives delayed clocks D4 and D5. The delay logic circuit LOC13 performs triggering according to delay time lengths of the delayed clocks D4 and D5 to provide a trigger signal TS13, and so on.

Figure 5:
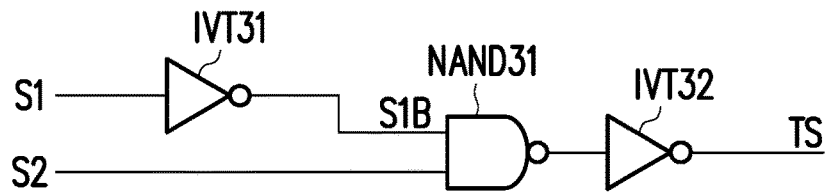
FIG. 5 is a schematic circuit diagram of a delay logic circuit according to an embodiment of the invention.

Further, referring to FIG. 5, FIG. 5 is a schematic circuit diagram of a delay logic circuit according to an embodiment of the invention. In the present embodiment, a delay logic circuit LOC is suitable for the delay logic circuits LOC11 to LOC18 shown in FIG. 4A. The delay logic circuit LOC includes an inverter IVT 31, an inverter IVT 32, and a NAND gate NAND31. An input terminal of the inverter IVT31 serves as a first input terminal of each of the delay logic circuits. A first input terminal of the NAND gate NAND31 is coupled to an output terminal of the inverter IVT31. A second input terminal of the NAND gate NAND31 is used as a second input terminal of the delay logic circuit LOC. An input terminal of the inverter IVT32 is coupled to an output terminal of the NAND gate NAND31. An output terminal of the inverter IVT32 serves as an output terminal of the delay logic circuit LOC. Timing of a signal S1 received by the first input terminal of the delay logic circuit LOC lags behind timing of a signal S2 received by the second input terminal of the delay logic circuit LOC. The delayed signal S1 is inverted by the inverter IVT32 to generate a signal S1B. The NAND gate NAND31 and the inverter IVT32 perform a logical AND operation on the signals S1B and S2 to provide a trigger signal TS. It may be learned that the delay logic circuit LOC may perform triggering according to a time delay of the signal S1 relative to the signal S2, thereby providing the trigger signal TS. In the present embodiment, the delay logic circuit LOC is triggered according to a time delay between a rising edge of the signal S1 and a rising edge of the signal S2.

Return to embodiments of FIG. 1, FIG. 4A, and FIG. 4B. In the present embodiment, the summer SUM1 is coupled to the delay logic circuits LOC11 to LOC18. The summer SUM1 includes NOR gates NOR21 to NOR25, NAND gates NAND21 and NAND22, and an inverter IVT21. The first input terminal and the second input terminal of the NOR gate NOR21 are respectively coupled to the output terminal of the delay logic circuit LOC11 and the output terminal of the delay logic circuit LOC12. The NOR gate NOR21 receives trigger signals TS11 and TS12. The first input terminal and the second input terminal of the NOR gate NOR22 are respectively coupled to the output terminal of the delay logic circuit LOC13 and the output terminal of the delay logic circuit LOC14. The NOR gate NOR22 receives trigger signals TS13 and TS14. The first input terminal and the second input terminal of the NOR gate NOR23 are respectively coupled to the output terminal of the delay logic circuit LOC15 and the output terminal of the delay logic circuit LOC16. The NOR gate NOR23 receives trigger signals TS15 and TS16. The first input terminal and the second input terminal of the NOR gate NOR24 are respectively coupled to the output terminal of the delay logic circuit LOC17 and the output terminal of the delay logic circuit LOC18. The NOR gate NOR24 receives trigger signals TS17 and TS18. The first input terminal and the second input terminal of the NAND gate NAND21 are respectively coupled to the output terminal of the NOR gate NOR21 and the output terminal of the NOR22. The first input terminal and the second input terminal of the NAND gate NAND22 are respectively coupled to the output terminal of the NOR gate NOR23 and the output terminal of the NOR24. The first input terminal and the second input terminal of the NOR gate NOR25 are respectively coupled to the output terminal of the NAND gate NAND21 and the output terminal of the NAND22. An input terminal of the inverter IVT21 is coupled to an output terminal of the NOR gate NOR25.

In the present embodiment, the summer SUM1 receives trigger signals TS11-TS18, and adds the trigger signals TS11-TS18 to generate an output clock CLK_OUT1. In other words, the summer SUM1 performs a logical OR operation on the trigger signals TS11-TS18 to generate the output clock CLK_OUT.

Figure 6:
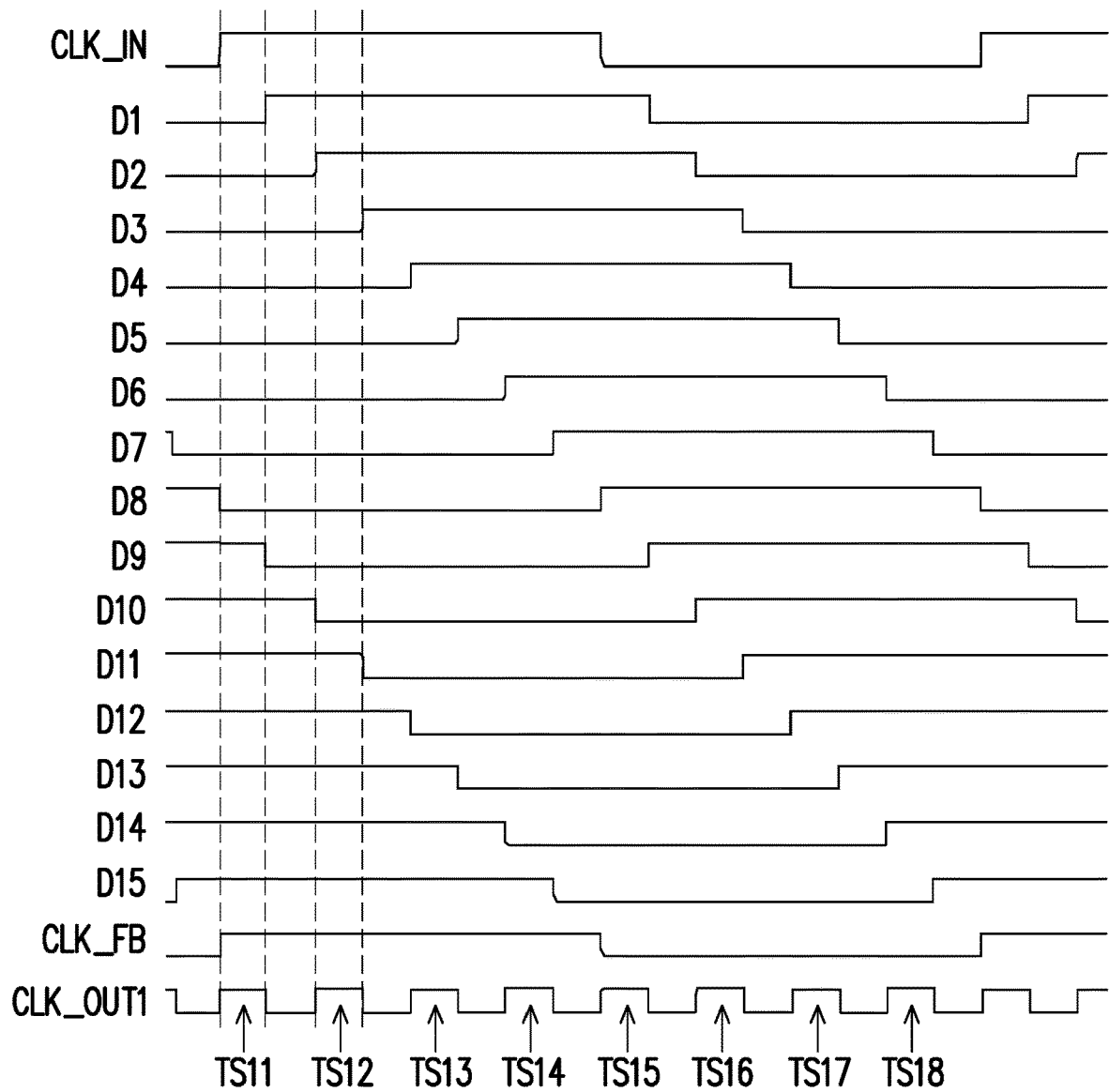
FIG. 6 is a timing diagram of an input clock, a delayed clock, and a feedback clock according to a first embodiment of the invention.

Referring to FIG. 1 and FIG. 6 together, FIG. 6 is a timing diagram of an input clock, a delayed clock, and a feedback clock according to a first embodiment of the invention. In the present embodiment, the trigger signal TS11 is generated according to a time delay between a rising edge of the input clock CLK_IN and a rising edge of the delayed clock D1. The trigger signal TS12 is generated according to a time delay between a rising edge of the delayed clock D2 and arising edge of the delayed clock D3. The trigger signal TS13 is generated according to a time delay between a rising edge of the delayed clock D4 and a rising edge of the delayed clock D5, and so on. The output clock generator 120 adds the trigger signals TS11-TS18 to generate the output clock CLK_OUT1. Therefore, based on the first embodiment, the frequency of the output clock CLK_OUT1 provided by the output clock generator 120 is 8 times the frequency of the input clock CLK_IN.

Figure 7A:
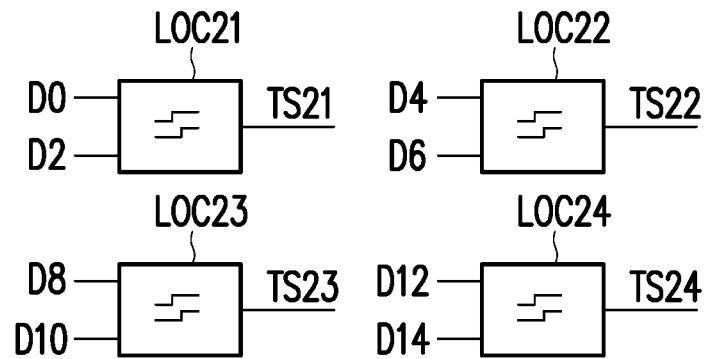
FIG. 7A is a schematic circuit diagram of a delay logic circuit according to a second embodiment of the invention.
Figure 7B:
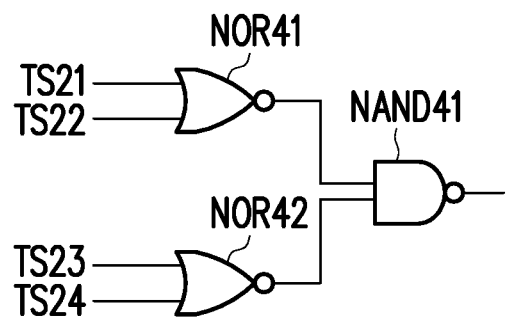
FIG. 7B is a schematic circuit diagram of a summer according to a second embodiment of the invention.

Referring to FIG. 1, FIG. 7A, and FIG. 7B together, FIG. 7A is a schematic circuit diagram of a delay logic circuit according to a second embodiment of the invention. FIG. 7B is a schematic circuit diagram of a summer according to a second embodiment of the invention. In the present embodiment, an output clock generator 120 includes delay logic circuits LOC21 to LOC24 and a summer SUM2. The delay logic circuits LOC21 to LOC24 respectively receive an input clock CLK_IN and two of delayed clocks D1-D15, and perform triggering according to a delay time length between the input clock CLK_IN and the two of the delayed clocks D1-D15, respectively, to provide one of trigger signals TS21-TS24. For example, the delay logic circuit LOC21 receives the input clock CLK_IN and the delayed clock D2. The delay logic circuit LOC21 performs triggering according to the input clock CLK_IN and a delay time length of the delayed clock D2 to provide a trigger signal TS21. The delay logic circuit LOC22 receives delayed clocks D4 and D6. The delay logic circuit LOC22 performs triggering according to delay time lengths of the delayed clocks D4 and D6 to provide a trigger signal TS22. Similarly, the delay logic circuit LOC23 performs triggering according to delay time lengths of the delayed clocks D8 and D10 to provide a trigger signal TS23. The delay logic circuit LOC24 performs triggering according to delay time lengths of the delayed clocks D12 and D14 to provide a trigger signal TS24. The delay logic circuits LOC21 to LOC24 may be implemented through the delay logic circuit LOC shown in FIG. 5.

In the present embodiment, the summer SUM2 is coupled to the delay logic circuits LOC21 to LOC24. The summer SUM2 includes NOR gates NOR41 and NOR42, and a NAND gate NAND41. A first input terminal and a second input terminal of the NOR gate NOR41 are respectively coupled to an output terminal of the delay logic circuit LOC21 and an output terminal of the delay logic circuit LOC22. The NOR gate NOR41 receives trigger signals TS21 and TS22.

A first input terminal and a second input terminal of the NOR gate NOR42 are respectively coupled to an output terminal of the delay logic circuit LOC23 and an output terminal of the delay logic circuit LOC24. The NOR gate NOR42 receives trigger signals TS23 and TS24. A first input terminal and a second input terminal of the NAND gate NAND41 are respectively coupled to an output terminal of the NOR gate NOR41 and an output terminal of the NOR42. In the present embodiment, the summer SUM2 receives trigger signals TS21-TS24, and adds the trigger signals TS21-TS24 to generate an output clock CLK_OUT2.

Figure 8:
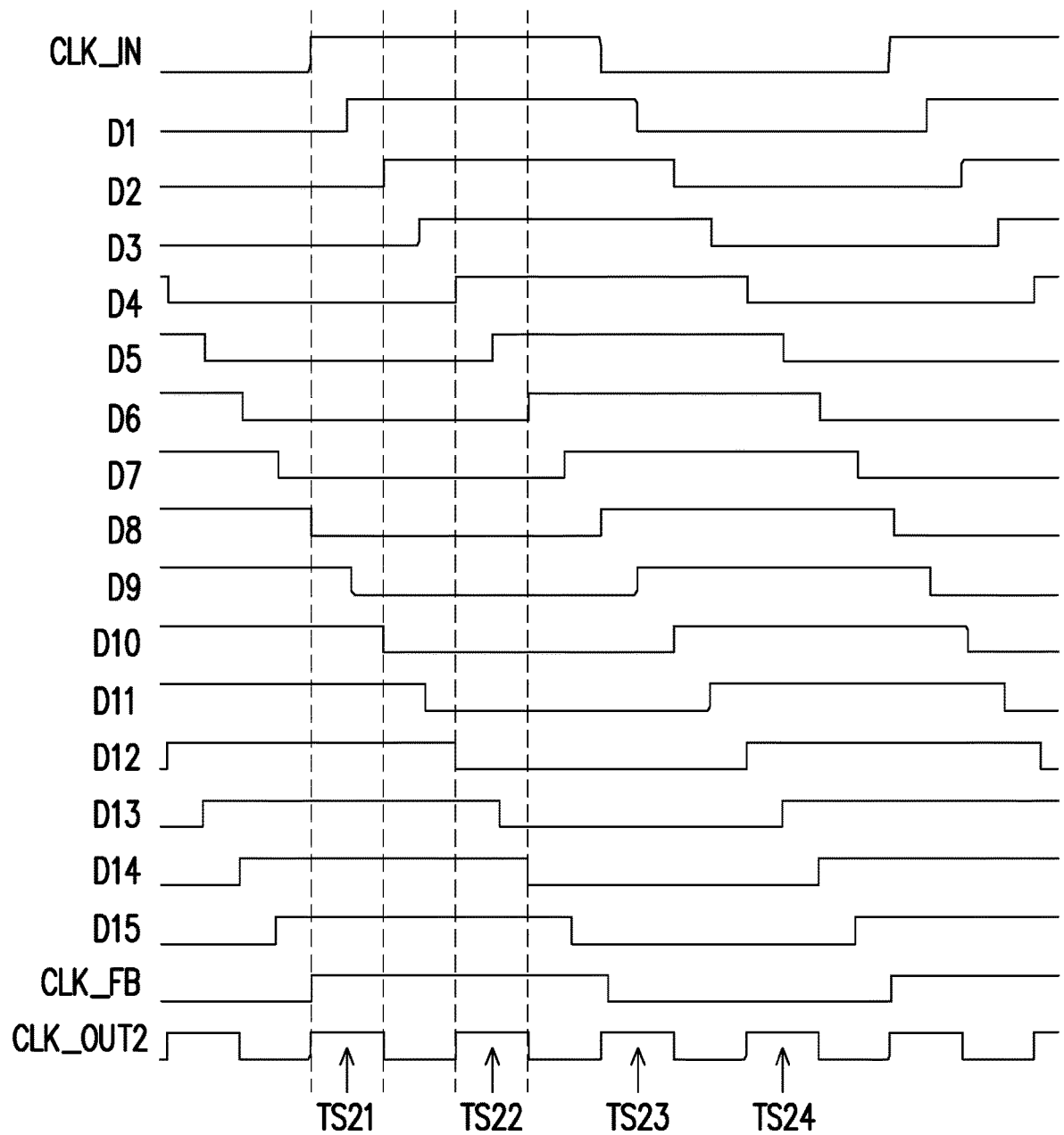
FIG. 8 is a timing diagram of an input clock, a delayed clock, and a feedback clock according to a second embodiment of the invention.

Referring to FIG. 1 and FIG. 8 together, FIG. 8 is a timing diagram of an input clock, a delayed clock, and a feedback clock according to a second embodiment of the invention. In the present embodiment, a trigger signal TS21 is generated according to a time delay between a rising edge of an input clock CLK_IN and a rising edge of a delayed clock D2. The trigger signal TS22 is generated according to a time delay between a rising edge of a delayed clock D4 and a rising edge of a delayed clock D6. The trigger signal TS23 is generated according to a time delay between a rising edge of a delayed clock D8 and a rising edge of a delayed clock D10. The trigger signal TS24 is generated according to a time delay between a rising edge of a delayed clock D12 and arising edge of a delayed clock D14. An output clock generator 120 adds trigger signals TS21-TS24 to generate an output clock CLK_OUT2. Therefore, based on the second embodiment, a frequency of the output clock CLK_OUT2 provided by the output clock generator 120 is 4 times a frequency of the input clock CLK_IN.

Figure 9A:
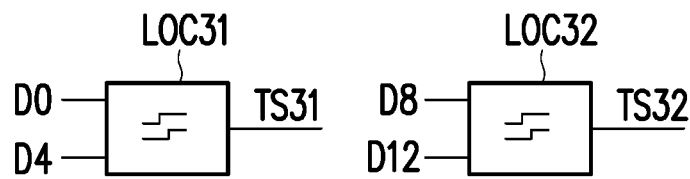
FIG. 9A is a schematic circuit diagram of a delay logic circuit according to a third embodiment of the invention.
Figure 9B:
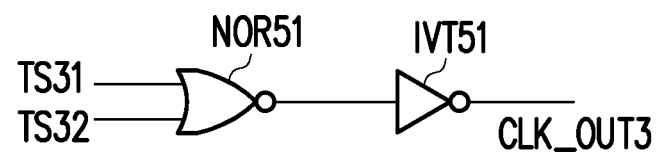
FIG. 9B is a schematic circuit diagram of a summer according to a third embodiment of the invention.

Referring to FIG. 1, FIG. 9A, and FIG. 9B together, FIG. 9A is a schematic circuit diagram of a delay logic circuit according to a third embodiment of the invention. FIG. 9B is a schematic circuit diagram of a summer according to a third embodiment of the invention. In the present embodiment, an output clock generator 120 includes delay logic circuits LOC31 and LOC32, and a summer SUM3. The delay logic circuits LOC31 and LOC32 respectively receive an input clock CLK_IN and two of delayed clocks D1-D15, and perform triggering according to a delay time length between the input clock CLK_IN and the two of the delayed clocks D1-D15, respectively, to provide one of trigger signals TS31 and TS32. For example, the delay logic circuit LOC31 receives the input clock CLK_IN and a delayed clock D4. The delay logic circuit LOC31 performs triggering according to the input clock CLK_IN and a delay time length of the delayed clock D4 to provide a trigger signal TS31. The delay logic circuit LOC32 receives delayed clocks D8 and D12. The delay logic circuit LOC32 performs triggering according to delay time lengths of the delayed clocks D8 and D12 to provide a trigger signal TS32. The delay logic circuits LOC31 and LOC32 may be implemented through the delay logic circuit LOC shown in FIG. 5.

In the present embodiment, the summer SUM3 is coupled to the delay logic circuits LOC31 and LOC32. The summer SUM3 includes a NOR gate NOR51 and an inverter IVT51. A first input terminal and a second input terminal of the NOR gate NOR51 are respectively coupled to the delay logic circuits LOC31 and LOC32. The NOR gate NOR41 receives trigger signals TS21 and TS22. An input terminal of the inverter IVT51 is coupled to an output terminal of the NOR gate NOR41. In the present embodiment, the summer SUM3 receives trigger signals TS31 and TS32, and adds the trigger signals TS31 and TS32 to generate an output clock CLK_OUT3.

Figure 10:
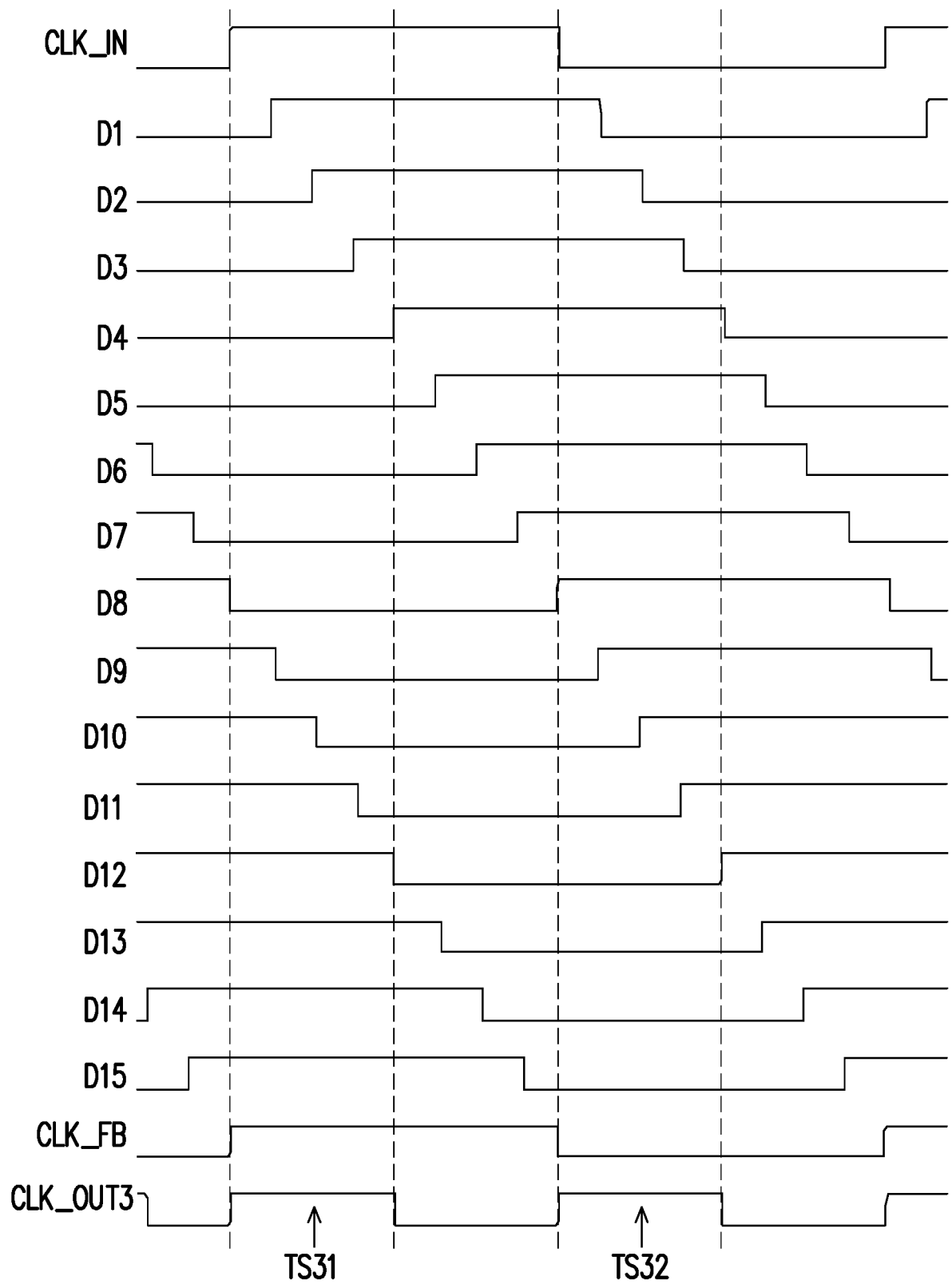
FIG. 10 is a timing diagram of an input clock, a delayed clock, and a feedback clock according to a third embodiment of the invention.

Referring to FIG. 1 and FIG. 10 together, FIG. 10 is a timing diagram of an input clock, a delayed clock, and a feedback clock according to a third embodiment of the invention. In the present embodiment, a trigger signal TS31 is generated according to a time delay between a rising edge of an input clock CLK_IN and a rising edge of a delayed clock D4. A trigger signal TS32 is generated according to a time delay between a rising edge of a delayed clock D8 and a rising edge of a delayed clock D12. An output clock generator 120 adds trigger signals TS31-TS32 to generate an output clock CLK_OUT3. Therefore, based on the third embodiment, a frequency of the output clock CLK_OUT3 provided by the output clock generator 120 is 2 times a frequency of the input clock CLK_IN.

In some embodiments, the output clock generator 120 may include at least two of the first embodiment, the second embodiment, and the third embodiment. The output clock generator 120 may select one of the foregoing plurality of embodiments by multiplexing to determine the frequency of the output clock CLK_OUT (for example, 2 times, 4 times, or 8 times the frequency of the input clock CLK_IN).

Further, based on the teaching provided by the foregoing embodiments, the clock multiplier 100 may provide an output clock CLK_OUT with different frequencies through the configuration of a delay line 110 and the output clock generator 120. A plurality of frequencies of the output clock CLK_OUT are $2^L$ times the frequency of the input clock CLK_IN, where L is a positive integer.

Figure 11:
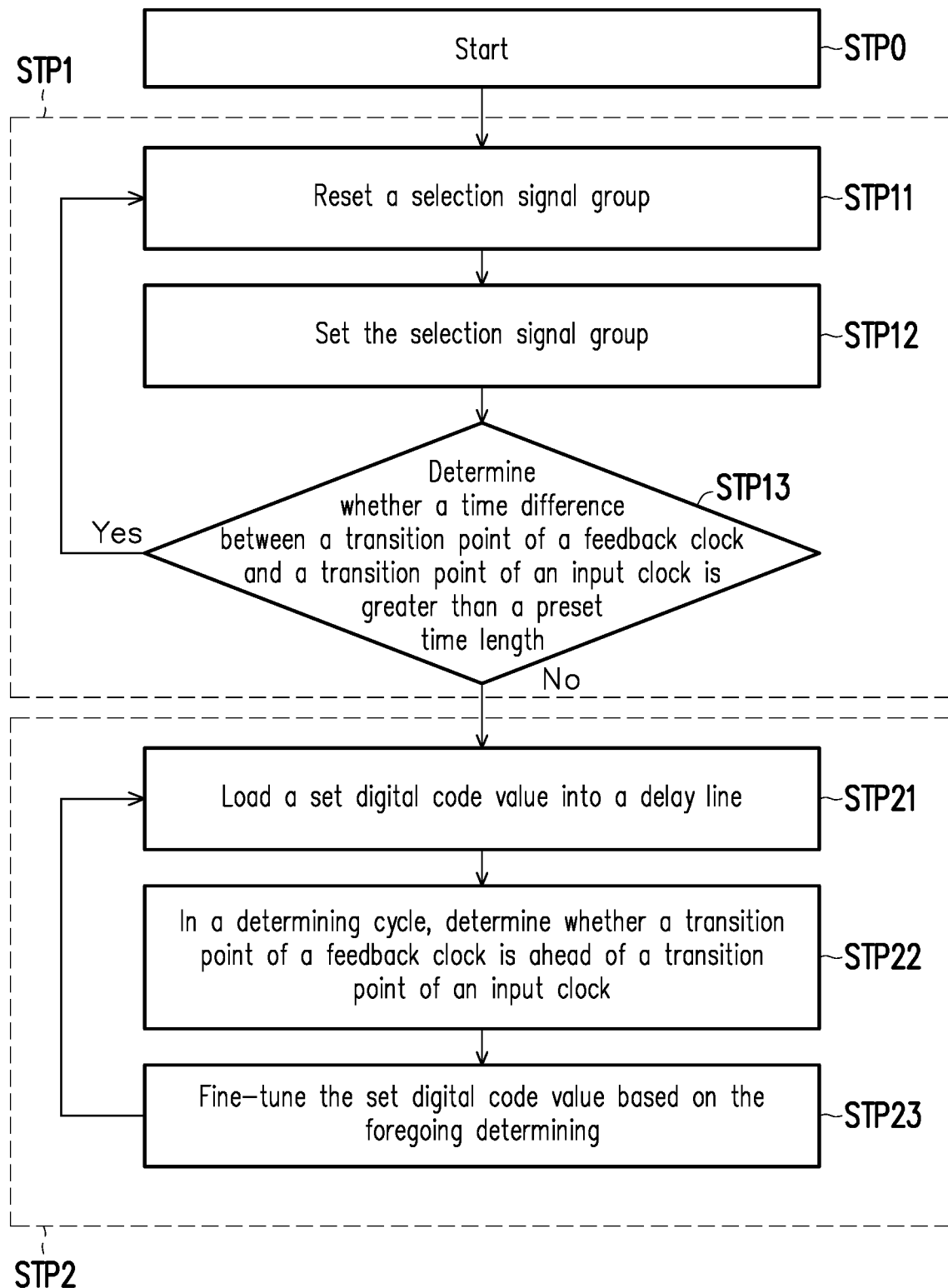
FIG. 11 is an operation flowchart of a delay controller according to an embodiment of the invention.

Referring to FIG. 1 and FIG. 11 together, FIG. 11 is an operation flowchart of a delay controller according to an embodiment of the invention. In the present embodiment, the delay controller 130 starts operation in step STP0, and performs an adjustment operation in step STP1. In the present embodiment, step STP1 includes steps STP11-STP13. Steps STP11 to STP13 correspond to at least one different cycle of the input clock CLK_IN, respectively. Step STP11 may be regarded as a "third adjustment cycle". Step STP12 may be regarded as a "first adjustment cycle". Step STP13 may be regarded as a "second adjustment cycle".

In step STP11 (the third adjustment cycle), the delay controller 130 resets a selection signal group SEL[11:0]. In step STP12 (the first adjustment cycle), the delay controller 130 sets a selection signal group SEL[11:0]. In step STP13 (the second adjustment cycle), the delay controller 130 determines whether a time difference between a transition point of a feedback clock CLK_FB and a transition point of the input clock CLK_IN is greater than a preset time length. When the time difference between the transition point of the feedback clock CLK_FB and the transition point of the input clock CLK_IN is determined to be greater than the preset time length in a determining cycle, the delay controller 130 returns to step STP11 to reset the selection signal group SEL[11:0], and in step STP12, the selection signal group SEL[11:0] is adjusted via a successive approximation method. In the present embodiment, the preset time length may be, for example, 0.4 nanoseconds (the invention is not limited thereto).

In the present embodiment, the delay controller 130 determines whether a time difference between a rising edge in the transition point of the feedback clock CLK_FB and a rising edge in the transition point of the input clock CLK_IN is greater than a preset time length. In some embodiments, the delay controller 130 determines whether a time difference between a falling edge in the transition point of a feedback clock CLK_FB and a falling edge in the transition point of the input clock CLK_IN is greater than a preset time length.

Figure 12:
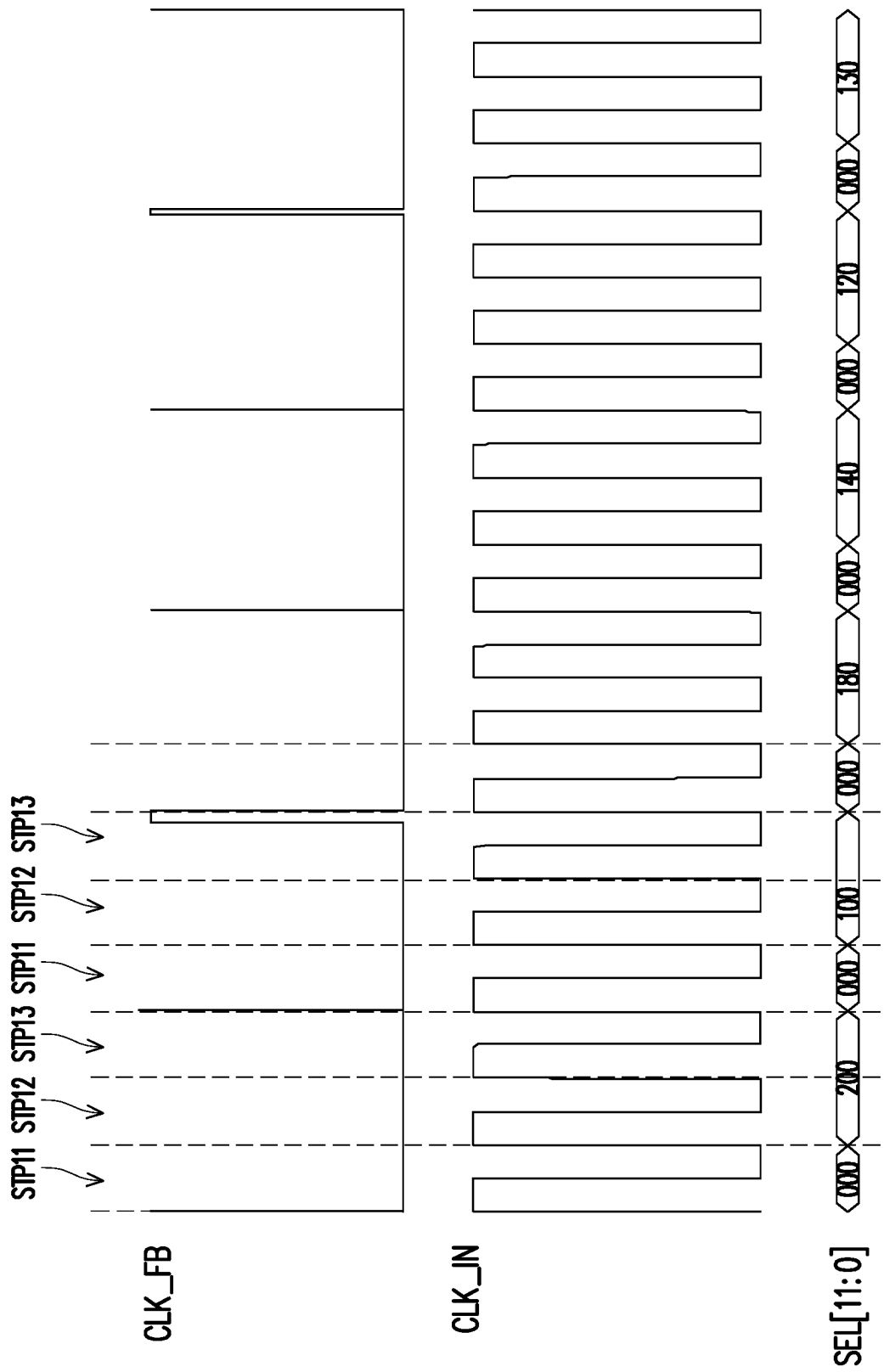
FIG. 12 is a schematic diagram illustrating an adjustment operation used for a selection signal group according to an embodiment of the invention.

For example, referring to FIG. 1, FIG. 11, and FIG. 12 together, FIG. 12 is a schematic diagram illustrating an adjustment operation used for a selection signal group according to an embodiment of the invention. In the present embodiment, first, in step STP11, a delay controller 130 provides a selection signal group SEL[11:0] corresponding to the hexadecimal digital code value "000" to the delay line. In this case, delayed clocks D1-D15 are not delayed. In step STP12, the delay controller 130 provides a selection signal group SEL[11:0] corresponding to the hexadecimal digital code value "800" to the delay line. "800" may be regarded as an initial digital code value (the present invention is not limited thereto). In other words, a logic value of the selection signal SEL[11] is changed from "0" to "1".

In step STP13, the delay controller 130 determines a time difference between the transition point of the feedback clock CLK_FB and the transition point of the input clock CLK_IN is greater than the preset time length, and determines that timing of the feedback clock CLK_FB lags behind timing of the input clock CLK_IN. The delay controller 130 resets the selection signal group SEL[11:0] in step STP11. The delay controller 130 provides a selection signal group SEL[11:0] corresponding to the digital code value "400" in step STP12. In other words, a logic value of the selection signal SEL[10] is changed from "0" to "1", and so on. In the present embodiment, step STP13 may be implemented by a single third adjustment cycle or a plurality of third adjustment cycles. It may be learned from this that when the delay controller 130 determines that the time difference between the transition point of the feedback clock CLK_FB and the transition point of the input clock CLK_IN is greater than the preset time length, and the timing of the feedback clock CLK_FB lags behind the timing of the input clock CLK_IN, the logic value of the selection signal of the least bit with a logic value of "1" in the previous step STP13 is set to "0", and the logic value of the selection signal of the next bit is changed from "0" to "1".

It should be noted that, based on the cycle of step STP1 described above, after the determining operation of step STP13 and before setting the selection signal group SEL[11:0], the delay controller 130 resets the selection signal group SEL[11:0]. In addition, the delay controller 130 receives the feedback clock CLK_FB only in step STP13. In this way, in the present embodiment, the feedback clock CLK_FB remaining in the delay line 110 in the previous cycle may be rapidly output in one cycle, to avoid the erroneous determining of the delay controller 130.

After the cycle of step STP1 for a plurality of times, the delay controller 130 provides a selection signal group SEL [11:0] corresponding to the digital code value "100" in step STP12. In step STP13, the delay controller 130 determines that a time difference between the transition point of the feedback clock CLK_FB and the transition point of the input clock CLK_IN is greater than the preset time length, and determines that the timing of the feedback clock CLK_FB is ahead of the timing of the input clock CLK_IN. After resetting the selection signal group SEL[11:0] in step STP11, the delay controller 130 provides a selection signal group SEL[11:0] with a digital code value "180" in step STP12. In other words, logic values of selection signals SEL[8] and SEL[7] are changed from "0" to "1". It may be learned from this that when the delay controller 130 determines that the time difference between the transition point of the feedback clock CLK_FB and the transition point of the input clock CLK_IN is greater than the preset time length, and the timing of the feedback clock CLK_FB lags behind the timing of the input clock CLK_IN, the logic value of the selection signal of the least bit with a logic value of "1" in the previous step STP13 is set to "1", and the logic value of the selection signal of the next bit is changed from "0" to "1".

In step STP13, the delay controller 130 determines that a time difference between the transition point of the feedback clock CLK_FB and the transition point of the input clock CLK_IN is greater than the preset time length, and determines that the timing of the feedback clock CLK_FB lags behind the timing of the input clock CLK_IN. After resetting the selection signal group SEL[11:0] in step STP11, the delay controller 130 provides a selection signal group SEL [11:0] with a digital code value "140" in step STP12. In step STP13, the delay controller 130 determines that a time difference between the transition point of the feedback clock CLK_FB and the transition point of the input clock CLK_IN is greater than the preset time length, and determines that the timing of the feedback clock CLK_FB lags behind the timing of the input clock CLK_IN. After resetting the selection signal group SEL[11:0] in step STP11, the delay controller 130 provides a selection signal group SEL[11:0] with a digital code value "120" in step STP12. In step STP13, the delay controller 130 determines that the time difference between the transition point of the feedback clock CLK_FB and the transition point of the input clock CLK_IN is greater than the preset time length, and determines that the timing of the feedback clock CLK_FB is ahead of the timing of the input clock CLK_IN. After resetting the selection signal group SEL[11:0] in step STP11, the delay controller 130 provides a selection signal group SEL[11:0] with a digital code value "130" in step STP12.

Next, in step STP13, the delay controller 130 determines that the time difference between the transition point of the feedback clock CLK_FB and the transition point of the input clock CLK_IN is less than the preset time length. In this case, the delay controller 130 obtains the digital code value adjusted in the last first adjustment cycle (step STP12) as a set digital code value, that is, "130". The delay controller 130 performs a tracking operation on the feedback clock CLK_FB according to the adjustment of the set digital code value.

Return to FIG. 1 and FIG. 11. In the present embodiment, after the set digital code value is determined, the delay controller 130 starts to perform a tracking operation on the feedback clock CLK_FB according to the adjustment of the set digital code value. In the present embodiment, step STP2 includes steps STP21-STP23. Steps STP21 to STP23 correspond to at least one different cycle of the input clock CLK_IN, respectively. Step STP21 may be regarded as a "first tracking cycle". Step STP22 may be regarded as a "second tracking cycle". Step STP23 may be regarded as a "third tracking cycle". In step STP21 (the first tracking cycle), the delay controller 130 loads a selection signal group SEL[11:0] corresponding to the set digital code value into the delay line 110. In step STP22 (the second tracking cycle), the delay controller 130 determines whether a transition point of the feedback clock CLK_FB is ahead of a transition point of the input clock CLK_IN. In step STP23 (the third tracking cycle), the delay controller 130 fine-tunes the set digital code value based on the foregoing determining.

Figure 13:
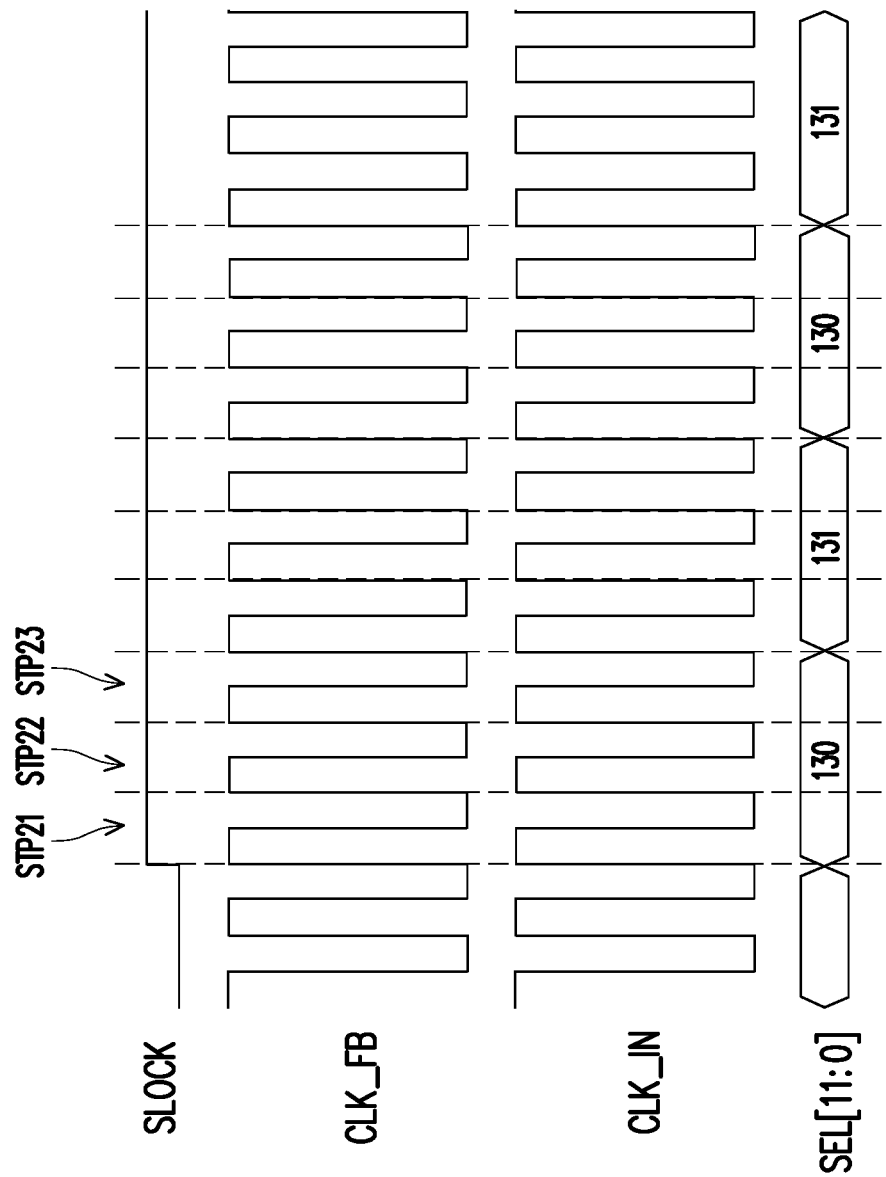
FIG. 13 is a schematic diagram illustrating a tracking operation used for a selection signal group according to an embodiment of the invention.

For example, referring to FIG. 1, FIG. 11, and FIG. 13 together, FIG. 13 is a schematic diagram illustrating a tracking operation used for a selection signal group according to an embodiment of the invention. In the present embodiment, after learning that the set digital code value is equal to "130", a delay controller 130 loads a selection signal group SEL[11:0] corresponding to the set digital code value into a delay line 110 in step STP21. In step STP22, the delay controller 130 determines whether a transition point of a feedback clock CLK_FB is ahead of a transition point of an input clock CLK_IN. When it is determined that the transition point of the feedback clock CLK_FB is ahead of the transition point of the input clock CLK_IN in step STP22 (the second tracking cycle), the delay controller 130 adds a fine-tuned value to the set digital code value in step STP23 (the third tracking cycle). In another aspect, when it is determined that the transition point of the feedback clock CLK_FB lags behind the transition point of the input clock CLK_IN in step STP22, the delay controller 130 subtracts a fine-tuned value from the set digital code value in step STP23. The fine-tuned value may be, for example, 1. Therefore, in the present embodiment, in a stable condition, the digital code value of the selection signal group SEL[11:0] changes between "130" and "131". In this way, the timing of the feedback clock CLK_FB may be substantially consistent with the timing of the input clock CLK_IN.

For another example, when the temperature or the supply voltage changes, the timing of the feedback clock CLK_FB or the timing of the input clock CLK_IN may change. The delay controller 130 may enable the timing of the feedback clock CLK_FB to be close to the timing of the input clock CLK_IN through the tracking operations for a plurality of times. In this way, the timing of the feedback clock CLK_FB may be close to the timing of the input clock CLK_IN in different environmental conditions.

In the present embodiment, when the delay controller 130 determines that a time difference between the transition point of the feedback clock CLK_FB and the transition point of the input clock CLK_IN is less than a preset time length, a logic value of a lock signal SLOCK is changed from "0" to "1". The delay controller 130 performs a tracking operation according to a lock signal SLOCK with a logic value equal to "1". When the clock multiplier 100 is restarted or the clock multiplier 100 changes the frequency of the output clock CLK_OUT, the logic value of the lock signal SLOCK is changed from "1" to "0". The delay controller 130 performs an adjustment operation according to the lock signal SLOCK with a logic value equal to "0".

Based on the above, the clock multiplier of the invention may adjust the selection signal group according to the timing difference between the input clock and the feedback clock through the delay controller, so that the transition point of the feedback clock approaches the transition point of the input clock. In this way, the clock multiplier may perform accurate frequency multiplication processing on the input clock. The clock multiplier may reset the selection signal group in the third adjustment cycle after the determining operation of the second adjustment cycle and before the setting of the selection signal group in the first adjustment cycle. In this way, the clock multiplier may enable the feedback clock CLK_FB remaining in the delay line in the previous cycle to be rapidly output in one cycle, to avoid the erroneous determining of the delay controller. In addition to this, when the temperature or the supply voltage changes, the timing of the feedback clock or the timing of the input clock may change. The clock multiplier may enable the timing of the feedback clock to be close to the timing of the input clock through the tracking operations for a plurality of times. In this way, the timing of the feedback clock may be close to the timing of the input clock in different environmental conditions.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A clock multiplier comprising:
    a delay line configured to receive an input clock and delay the input clock according to a selection signal group with multiple bits to provide a plurality of delayed clocks and a feedback clock, wherein the input clock, the delayed clocks, and the feedback clock have a same clock cycle;
    an output clock generator coupled to the delay line and configured to receive the input clock and the delayed clocks and perform a logic operation on the input clock and a portion of the delayed clocks to generate an output clock, wherein a frequency of the output clock is $2^L$ times a frequency of the input clock, where L is a positive integer; and
    a delay controller coupled to the delay line and configured to receive the input clock and the feedback clock and adjust the selection signal group according to a timing difference between the input clock and the feedback clock, so that a transition point of the feedback clock approaches a transition point of the input clock.

2. The clock multiplier according to claim 1, wherein
    the delay line comprises a plurality of delay unit strings coupled in series with each other,
    an output terminal of an $N^{th}$-stage delay unit string in the delay unit strings is configured to provide an $N^{th}$ delayed clock in the delayed clocks according to the selection signal group, and
    N is a positive integer.

3. The clock multiplier according to claim 2, wherein an $(N+1)^{th}$ delayed clock provided by an $(N+1)^{th}$-stage delay unit string in the delay unit strings lags behind the $N^{th}$ delayed clock by a delay time length, and a cycle of the input clock is an integer multiple of the delay time length.

4. The clock multiplier according to claim 3, wherein the delay units each comprise:
    a first NAND gate;
    a second NAND gate, a first input terminal of the second NAND gate and a first input terminal of the first NAND gate being configured to serve as clock input terminals of the delay units;
    a first inverter, an input terminal of the first inverter and a second input terminal of the first NAND gate being configured to serve as selection signal input terminals of the delay units, and an output terminal of the first inverter being coupled to a second input terminal of the second NAND gate;
    a delay element, an input terminal of the delay element being coupled to an output terminal of the first NAND gate;
    a NOR gate, a first input terminal of the NOR gate being coupled to an output terminal of the delay element, and a second input terminal of the NOR gate being coupled to the output terminal of the first inverter;
    a second inverter, an input terminal of the second inverter being coupled to an output terminal of the NOR gate; and
    a third NAND gate, a first input terminal of the third NAND gate being coupled to an output terminal of the second inverter, a second input terminal of the third NAND gate being coupled to an output terminal of the second NAND gate, and an output terminal of the third NAND gate being configured to serve as an output terminal of each of the delay units.

5. The clock multiplier according to claim 3, wherein the delay time length is directly proportional to a digital code value of the selection signal group.

6. The clock multiplier according to claim 2, wherein the delay unit strings each comprise a plurality of multistage delay units, wherein the delay units are coupled in series, and the delay units respectively correspond to a plurality of selection signals in the selection signal group, and respectively perform delay operations based on logic values of the selection signals.

7. The clock multiplier according to claim 6, wherein a plurality of sub-delay time lengths provided by the delay units are different from each other.

8. The clock multiplier according to claim 6, wherein a sub-delay time length provided by a $P^{th}$-stage delay unit in the delay units is twice a sub-delay time length provided by a $(P+1)^{th}$-stage delay unit in the delay units, P being a positive integer.

9. The clock multiplier according to claim 1, wherein
    an output terminal of an $M^{th}$-stage delay unit string in the delay unit strings is configured to provide the feedback clock according to the selection signal group, and
    M is a quantity of the delay unit strings.

10. The clock multiplier according to claim 1, wherein the output clock generator comprises:
    a plurality of delay logic circuits respectively configured to receive the input clock and two of the delayed clocks, and perform triggering according to a delay time length between the input clock and the two of the delayed clocks to provide one of a plurality of trigger signals; and
    a summer coupled to the delay logic circuits and configured to receive the trigger signals, and add the trigger signals to generate the output clock.

11. The clock multiplier according to claim 10, wherein the delay logic circuits each comprise:
    a first inverter, an input terminal of the first inverter being configured to serve as a first input terminal of each of the delay logic circuits;
    a NAND gate, a first input terminal of the NAND gate being coupled to an output terminal of the first inverter, and a second input terminal of the NAND gate being configured to serve as a second input terminal of each of the delay logic circuits; and a second inverter, an input terminal of the second inverter being coupled to an output terminal of the NAND gate, and an output terminal of the second inverter being configured to serve as an output terminal of each of the delay logic circuits.

12. The clock multiplier according to claim 11, wherein timing of a clock received by a first input terminal of a first delay logic circuit in the delay logic circuits lags behind timing of a clock received by a second input terminal of the first delay logic circuit.

13. The clock multiplier according to claim 10, wherein each of the delay logic circuits performs triggering according to a time delay between rising edges of the input clock and two of the delayed clocks.

14. The clock multiplier according to claim 10, wherein the summer performs a logical OR operation on the trigger signals to generate the output clock.

15. The clock multiplier according to claim 1, wherein the delay controller is further configured to perform an adjustment operation, the adjustment operation comprising:
   setting the selection signal group in a first adjustment cycle;
   in a second adjustment cycle, determining whether a time difference between the transition point of the feedback clock and the transition point of the input clock is greater than a preset time length; and
   when it is determined that the time difference between the transition point of the feedback clock and the transition point of the input clock is greater than the preset time length in the second adjustment cycle, resetting the selection signal group in a third adjustment cycle, and adjusting the selection signal group in a next first adjustment cycle.

16. The clock multiplier according to claim 15, wherein the adjustment operation further comprises adjusting the selection signal group via a successive approximation method in the next first adjustment cycle.

17. The clock multiplier according to claim 15, wherein the delay controller is further configured to:
   when it is determined that the time difference between the transition point of the feedback clock and the transition point of the input clock is less than or equal to the preset time length in the second adjustment cycle, obtain a set digital code value of the selection signal group adjusted in a last first adjustment cycle, and perform a tracking operation on the feedback clock according to adjustment of the set digital code value.

18. The clock multiplier according to claim 17, wherein the tracking operation comprises:
   loading, into the delay line, the selection signal group corresponding to the set digital code value in a first tracking cycle; and
   in a second tracking cycle, determining whether the transition point of the feedback clock is ahead of the transition point of the input clock, and when it is determined that the transition point of the feedback clock is ahead of the transition point of the input clock in the second tracking cycle, adding a fine-tuned value to the set digital code value in a third tracking cycle.

19. The clock multiplier according to claim 18, wherein the tracking operation further comprises:
   when it is determined that the transition point of the feedback clock lags behind the transition point of the input clock in the second tracking cycle, subtracting the fine-tuned value from the set digital code value in the third tracking cycle.

20. The clock multiplier according to claim 18, wherein the fine-tuned value is equal to 1.

* * * * *